United States Patent
Qin et al.

(10) Patent No.: US 11,404,329 B2
(45) Date of Patent: Aug. 2, 2022

(54) DEVICE AND METHOD FOR ON-LINE MEASUREMENT OF WAFER GRINDING FORCE

(71) Applicant: Beijing University of Technology, Beijing (CN)

(72) Inventors: Fei Qin, Beijing (CN); Lixiang Zhang, Beijing (CN); Shuai Zhao, Beijing (CN); Pei Chen, Beijing (CN); Tong An, Beijing (CN); Yanwei Dai, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 434 days.

(21) Appl. No.: 16/483,027

(22) PCT Filed: Oct. 30, 2018

(86) PCT No.: PCT/CN2018/112610
§ 371 (c)(1),
(2) Date: Aug. 1, 2019

(87) PCT Pub. No.: WO2020/077670
PCT Pub. Date: Apr. 23, 2020

(65) Prior Publication Data
US 2021/0407863 A1    Dec. 30, 2021

(30) Foreign Application Priority Data
Oct. 15, 2018    (CN) .......................... 201811194797.8

(51) Int. Cl.
*H01L 21/00* (2006.01)
*H01L 21/66* (2006.01)
(Continued)

(52) U.S. Cl.
CPC .............. *H01L 22/10* (2013.01); *B24B 7/228* (2013.01); *B24B 49/04* (2013.01); *H01L 21/30625* (2013.01); *H01L 21/67253* (2013.01)

(58) Field of Classification Search
CPC ......... H01L 21/30625; H01L 21/67253; H01L 22/10; B24B 7/228; B24B 49/04
(Continued)

(56) References Cited

U.S. PATENT DOCUMENTS 6,010,538 A * 1/2000 Sun ....................... B24B 37/013
156/345.13
2019/0143474 A1* 5/2019 Wang ................... B24B 37/105
438/5

FOREIGN PATENT DOCUMENTS

CN         1981992 A     6/2007
CN       102441840 A     5/2012
(Continued)

*Primary Examiner* — Brook Kebede
(74) *Attorney, Agent, or Firm* — Leonid Kisselev

(57) ABSTRACT

A method and apparatus for on-line measurement of the wafer thinning and grinding force, related to the field of ultra-precision machining of semiconductor wafer materials. The grinding force measuring apparatus comprises a semiconductor wafer, a worktable, a bearing table, a thin film pressure sensor, and a data processing and wireless transmission module. The grinding force measuring method includes sensor calibration based on the testing device and on-line measurement of grinding force. Using the grinding force measuring device and method provided by the invention, the grinding force in the semiconductor wafer grinding process can be monitored in real time, which is of great significance for semiconductor processing and reducing grinding damage. The invention also has the following characteristics: the sensor adopts a film pressure sensor, the response time is short, and the test precision is high; the data
(Continued)

transmission adopts a wireless transmission design, thus the grinding force can be monitored in real time during the wafer and spindle rotation process and the risk of winding during wafer rotation can be avoided. The sensor adopts a distributed design, which can monitor the distribution of the grinding force along the wafer radial direction or crystal orientation.

10 Claims, 1 Drawing Sheet

(51) Int. Cl.
    *B24B 7/22*     (2006.01)
    *B24B 49/04*     (2006.01)
    *H01L 21/306*     (2006.01)
    *H01L 21/67*     (2006.01)

(58) Field of Classification Search
    USPC .......................................................... 438/14
    See application file for complete search history.

(56) References Cited

FOREIGN PATENT DOCUMENTS

| | | |
|---|---|---|
| CN | 105598805 A | 5/2016 |
| CN | 206393384 U | 8/2017 |
| KR | 20150002483 A | 1/2015 |

\* cited by examiner

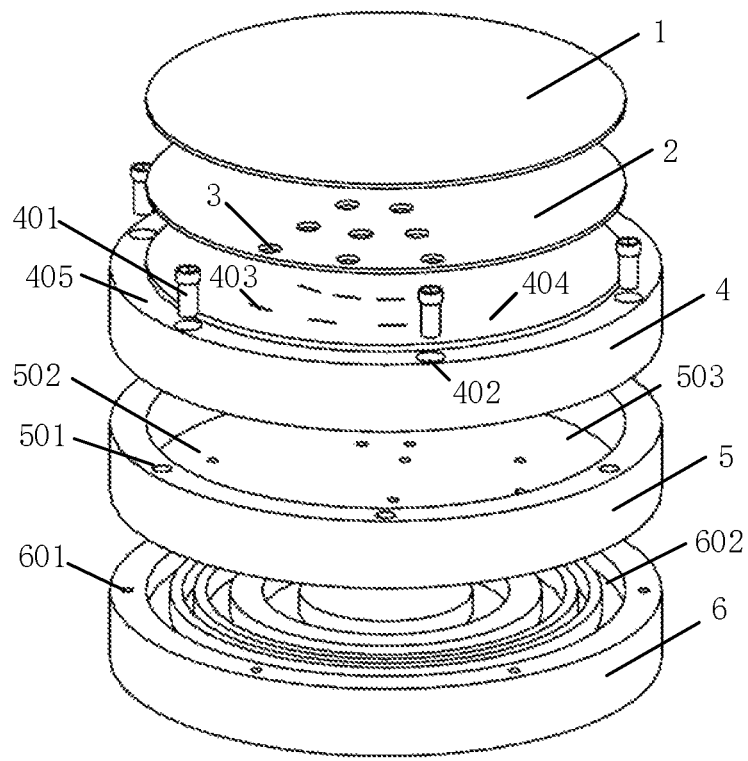
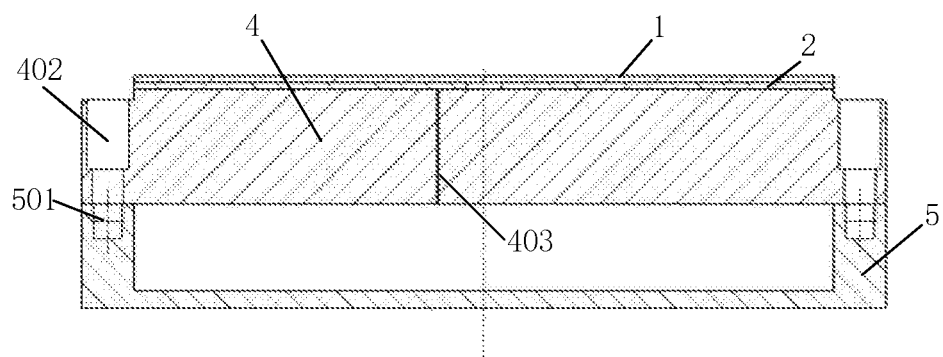
Fig. 1a
Fig. 1b

DEVICE AND METHOD FOR ON-LINE MEASUREMENT OF WAFER GRINDING FORCE

CROSS REFERENCE TO RELATED APPLICATION

This application is a national stage application of International application number PCT/CN2018/112610, filed on Oct. 30, 2018, titled "Device And Method For On-line Measurement Of Wafer Grinding Force", which claims the priority benefit of Chinese Patent Application No. 201811194797.8, filed on Oct. 15, 2018, which is hereby incorporated by reference in its entirety.

TECHNICAL FIELD

The invention relates to the field of ultra-precision machining of semiconductor wafer materials, in particular, to a device and method for on-line measurement of wafer grinding force.

BACKGROUND ART

Wafer thinning of semiconductor is an indispensable process in the field of integrated circuit (IC) manufacturing. With the increase in high-density and miniaturized electronic devices, higher requirements have been placed on wafer thinning technology. Self-rotating grinding based on wafer is current mainstream wafer thinning technology. During grinding, the abrasive particles on the surface of the grinding wheel interact with the surface of the wafer to remove the material. This process inevitably leads to surface damage on silicon wafers, such as phase transition, dislocation, micro-crack, etc. These damages can reduce wafer strength and affect subsequent fabrication yield and package reliability. In order to reduce grinding damage, some scholars have studied the influence of grinding parameters (grinding wheel speed, wafer rotation speed, spindle feed rate) on subsurface damage. These studies have important significance for understanding the influence of grinding parameters on damage and optimizing grinding process. However, grinding force is the essential factor causing damage, on-time measurement of the grinding force in the grinding process is helpful to control the grinding quality in the grinding stage and to understand the formation of grinding damage.

At present, commercial grinding machines, such as DISCO DFG series, Okamoto GNX series and βseries produced by China Electronic Technology Group Co., LTD, often used spindle current monitoring to indirectly reflect grinding force. This method has the advantage of being simple to operate, but the change of current is not sensitive enough to meet the demand of precision machining. At the same time, spindle current is affected by grinding normal force and grinding tangential force, and there are many problems in monitoring grinding status by tracking spindle current. In order to ascertain the grinding force in the process of semiconductor wafer grinding, some scholars proposed to install the sensors on the air spindle and track the grinding force through the deformation of the spindle. But again, the force causing the deformation is not the grinding force in the contact area. In addition, the above indirect measurement methods all use wired signal transmission, which is quite different from the real grinding state.

SUMMARY

The purpose of the invention is to solve the problems of utilizing the high heat value in organic matter and comprehensively recovering valuable metal from waste integrated circuit board. At the same time, the glass fiber and other inorganic substances in the integrated circuit board can be separated and comprehensively utilized. The invention has the characteristics of high added value, low energy consumption, and standard exh The present disclosure provides a device and method for on-line measurement of the wafer grinding force to solve the problems above. The device places a thin film pressure sensor between a wafer to be processed and a worktable. The signal of the thin film pressure sensor is introduced into a cavity of a bearing table through a threading hole of the worktable. A data acquisition and wireless transmission module is placed in the cavity of the bearing table. Wireless signals are monitored externally by a computer with a wireless receiver.

The technical scheme of the invention is as follows:

A device for on-line measurement of the wafer grinding force, Including: a semiconductor wafer, a bonding adhesive, a thin film pressure sensor, a worktable, a bearing table, a wafer spindle base, a data acquisition and wireless transmission module, and a wireless receiving module. The semiconductor wafer is bonded to the work surface of the worktable. Thickness of the bonding adhesive is less than 300 μm. The bottom surface of the thin film pressure sensor is in the same plane with the bottom surface of the bonding adhesive, and the thickness of the thin film pressure sensor is 3-10 μm greater than that of the bonding adhesive. A cuboid shaped threading hole is disposed in the worktable and runs through the worktable. The threading hole's cross section length is larger than the width of the thin film pressure sensor and the threading hole's cross section width is larger than the thickness of the thin film pressure sensor. The thin film pressure sensor is connected to the data acquisition and wireless transmission module through a conducting wire that runs through the threading hole. The data acquisition and wireless transmission module is located in the cavity of the bearing table. The wireless receiving module monitors the grinding force voltage signal in real time through a wireless transmission protocol and monitors the grinding force in real time.

As a further improvement of this invention, the wafer to be processed is one of the silicon wafer, silicon carbide wafer, gallium arsenide wafer, zinc telluride cadmium wafer and zinc oxide wafer.

As a further improvement of this invention, the bonding adhesive is chosen from temporary bonding adhesive, blue thin film and double-sided adhesive tape.

As a further improvement of this invention, the bearing table comprises a cavity and a screw hole for placing and fixing the data acquisition and wireless transmission module.

A method for on-line measurement of the wafer grinding force, Includes the following steps:

Step 1: providing the wafer grinding force on-line measuring device based on the on-line measuring device of grinding force described above;

step 2: providing a calibrated force hammer, wherein the geometric shape of the head of the hammer is identical to the grinding tooth of the grinding wheel, applying a constant force migrating across the surface of the wafer; when the hammer migrates across the central position of the thin film pressure sensor, recording the pressure F1 of the hammer and the voltage U1 of the thin film pressure sensor; changing the pressure and repeating the above steps to establish a relationship between pressure F and voltage U;

step 3: installing the on-line measuring device of wafer thinning grinding force on the bench of the grinding machine, grinding a wafer, and monitoring the thin film pressure sensor voltage signal in real time; when the grinding wheel contacts and leaves the sensor, the voltage signal first increases and then decreases; recording the maximum voltage signal as $U_t$, deducing grinding force $F_t$ based on the relationship between pressure and voltage established in step 2, thus measuring the grinding force; wherein a corresponding stress is $\sigma = F_t/A_{max}$, wherein $A_{max}$ is the maximum contact area between the grinding tooth and the thin film pressure sensor.

Beneficial Effects

The grinding force measuring device and method provided by the invention can monitor the grinding force in the process of semiconductor wafer grinding in real time, providing significant benefit in reducing grinding damage in semiconductor processing. The invention also has the following characteristics: the sensor adopts a film pressure sensor, the response time is short, and the test precision is high; the data transmission adopts a wireless transmission design, thus the grinding force can be monitored in real time during the wafer and spindle rotation process and the risk of winding during wafer assembly can be avoided. The sensor adopts a distributed design, which can monitor the distribution of the grinding force along the wafer radial direction or crystal orientation.

BRIEF DESCRIPTION OF THE DRAWINGS

FIG. 1(a) is a structural diagram of a wafer grinding force on-line measuring device according to one embodiment of the present invention.

FIG. 1(b) is the sectional view of on-line wafer grinding force measuring device according to one embodiment of the present invention.

DETAILED DESCRIPTION OF THE PREFERRED EMBODIMENTS

Follow In order to illustrate the invention and render the invention easy to understand, some specific implementation methods of the invention are described in detail in combination with the drawings.

A wafer grinding force on-line measuring device as shown in FIG. 1 including:

A wafer grinding force on-line measuring device, comprising: a semiconductor wafer (1), a bonding adhesive (2), a thin film pressure sensor (3), a worktable (4), a bearing table (5), a wafer spindle base (6), a data acquisition and wireless transmission module, and a wireless receiving module; wherein the semiconductor wafer (1) is connected to a work surface (404) of the worktable (4) through the bonding adhesive (2), wherein the thickness of the bond adhesive (2) is less than 300 μm; wherein a bottom surface of the thin film pressure sensor (3) is in the same plane with a bottom surface of the bonding adhesive (2), and the thickness of the thin film pressure sensor (3) is 3-10 μm greater than that of the bonding adhesive (2); wherein a threading hole (403) is disposed in the worktable (4); the threading hole (403) is cuboid-shaped, and runs through the worktable (4); wherein the thin film pressure sensor (3) is connected to the data acquisition and wireless transmission module through a conducting wire that runs through the threading hole (403); wherein the threading hole's cross section length is larger than the width of the conducting wire and the threading hole's cross section width is larger than the thickness of the conducting wire; wherein the data acquisition and wireless transmission module is located in a cavity (503) of the bearing table (5) and affixed to the bearing table (5) through a bolt and a screw hole (502); wherein the bearing table (5) is affixed to the wafer spindle base (6) located on a grinding machine; and wherein bearing table (5) is affixed to the wafer spindle base (6) via adsorption or bolt fixation.

During the wafer grinding process, a grinding wheel interacts with the semiconductor wafer (1), force acting on the semiconductor wafer (1) is transferred to the thin film pressure sensor (2), resulting in the voltage changes when the pressure is perceived by the thin film pressure sensor (2). This voltage signal is sent to the data acquisition and wireless transmission module via the conducting wire, and further received by the wireless receiving module. The wireless receiving module collects the wireless signal and displays the signal in real time.

The bonding adhesive (2) is can be chosen from temporary bonding adhesive, blue thin film and double-sided adhesive tape, which is used to connect and support the semiconductor wafer (1).

The thin film pressure sensor (3) is a single-point thin film pressure sensor, or an array type thin film pressure sensor, or a combination thereof. The thin film pressure sensor (3) can be a resistance type thin film pressure sensor, or a capacitance type thin film pressure sensor. The number of the sensors can be one or a plurality. The sensors can be located or distributed along the direction of radius of the wafer, crystal direction of the wafer, or a combination of both. In one embodiment, Flexiforce A201, a single-point thin film pressure sensor from TEKSCAN company was used; Si (100) wafer was used as the wafer. Four sensors were placed in the <110> and <100> crystal directions of the wafer, with radius distances being 0 mm, 30 mm, 60 mm and 90 mm, respectively. In addition, sensors were arranged at positions where the radius distance between <110> and <100> orientations are 60 mm and 90 mm, respectively. In one embodiment, Nine sensors were arranged in total.

The worktable (4) comprises a work surface (404) and a fixed platform (405), the work surface (404) having a height not lower than that of the fixed platform (405). The worktable (4) comprises a threading hole (403) and a bolt hole (402). The threading hole (403) runs through the worktable (4) and is used for passing through the thin film pressure sensor (3). In one embodiment, the threading holes (403) are generated by wire cutting. Corresponding to the number of the sensors, the number of the threading holes is also nine.

The bearing table (5) comprises a cavity (503) and a screw hole (502). The connection between the bearing table (5) and the bench of the grinding machine may be a vacuum adsorption or a bolt connection. In one embodiment the connection is bolt connection.

The data acquisition and wireless transmission module includes resistance/voltage conversion, analog to digital conversion, signal amplification, signal acquisition and wireless transmission modules. In some embodiments, the wireless transmission module is based on Zigbee, bluetooth, WIFI, or 4G/5G wireless transmission. In one embodiment, the wireless transmission module adopts a T7 pro wireless transmission equipment of LABJACK company, which uses the wireless WIFI transmission protocol to transmit signals.

A method for on-line measurement of the wafer grinding force, Includes the following steps:

Step 1: providing the wafer grinding force on-line measuring device as described in claim 1;

step 2: providing a calibrated force hammer, applying a constant force migrating across the surface of the wafer; when the hammer migrates across the central position of the thin film pressure sensor, recording the pressure F1 of the hammer and the voltage U1 of the thin film pressure sensor; changing the pressure and repeating the above steps to establish a relationship between pressure F and voltage U;

step 3: installing the on-line measuring device of wafer thinning grinding force on the bench of the grinding machine, grinding a wafer, and monitoring the thin film pressure sensor voltage signal in real time; when a grinding wheel contacts and leaves the sensor, the voltage signal first increases and then decreases; recording the maximum voltage signal as $U_t$, deducing grinding force $F_t$ based on the relationship between pressure and voltage established in step 2, thus measuring the grinding force; wherein a corresponding stress is $\sigma=F_t/A_{max}$, wherein $A_{max}$ is the maximum contact area between a grinding tooth and the thin film pressure sensor.

What is claimed is:

1. A wafer grinding force on-line measuring device, comprising:
    a semiconductor wafer (1),
    a bonding adhesive (2),
    a thin film pressure sensor (3), a worktable (4),
    a bearing table (5),
    a wafer spindle base (6),
    a data acquisition and wireless transmission module, and
    a wireless receiving module;
    wherein the semiconductor wafer (1) is connected to a work surface (404) of the worktable (4) through the bonding adhesive (2), wherein the thickness of the bonding adhesive (2) is less than 300 μm; wherein a bottom surface of the thin film pressure sensor (3) is in the same plane with a bottom surface of the bonding adhesive (2), and the thickness of the thin film pressure sensor (3) is 3-10 μm greater than that of the bonding adhesive (2); wherein a threading hole (403) is disposed in the worktable (4), the threading hole (403) is cuboid-shaped, and runs through the worktable (4); wherein the thin film pressure sensor (3) is connected to the data acquisition and wireless transmission module through a conducting wire that runs through the threading hole (403); wherein the data acquisition and wireless transmission module is located in a cavity (503) of the bearing table (5) and affixed to the bearing table (5) through a bolt and a screw hole (502); and wherein the bearing table (5) is affixed to the wafer spindle base (6) located on a grinding machine.

2. A wafer grinding force on-line measuring device according to claim 1, wherein the wafer (1) is chosen from the group consisting of silicon wafer, silicon carbide wafer, gallium arsenide wafer, zinc telluride cadmium wafer, and zinc oxide wafer.

3. A wafer grinding force on-line measuring device according to claim 1, wherein the bonding adhesive (2) is chosen from the group consisting of temporary bonding adhesive, blue thin film, and double-sided adhesive tape.

4. A wafer grinding force on-line measuring device according to claim 1, wherein the thin film pressure sensor (3) is a single-point thin film pressure sensor, or an array type thin film pressure sensor, or a combination thereof.

5. A wafer grinding force on-line measuring device according to claim 1, wherein the thinfilm pressure sensor is uniformly distributed along direction of radius of the wafer or crystal direction of the wafer.

6. A wafer grinding force on-line measuring device according to claim 1, wherein the worktable (4) comprises the work surface (404), a fixed platform (405) and a bolt hole (402); wherein the work surface (404) have a height no lower than that of the fixed platform (405), wherein the thickness of the worktable (4) is no less than 1 cm.

7. A wafer grinding force on-line measuring device according to claim 1, wherein the bearing table (5) comprises the cavity (503) and the screw hole (502).

8. A wafer grinding force on-line measuring device according to claim 1, wherein the bearing table (5) and the grinding machine is affixed by vacuum adsorption or a bolt connection.

9. A method for on-line measurement of wafer grinding force, comprising the steps of:
    step 1: providing the wafer grinding force on-line measuring device as described in claim 1;
    step 2: providing a calibrated force hammer, applying a constant force migrating across the surface of the wafer; when the hammer migrates across a central position of the thin film pressure sensor, recording a pressure of the hammer and a voltage of the thin film pressure sensor; changing the pressure and repeating the above steps to establish a relationship between the pressure of the hammer and the voltage of the thin film pressure sensor; and
    step 3: installing the on-line measuring device of wafer thinning grinding force on a bench of a grinding machine, grinding a wafer, and monitoring the thin film pressure sensor voltage signal in real time, wherein when a grinding wheel contacts and leaves the thin film pressure sensor, the voltage signal first increases and then decreases; recording the maximum voltage signal as $U_t$, deducing grinding force Ft based on the relationship between pressure and voltage established in step 2, thus measuring the grinding force;
    wherein a corresponding stress is $\sigma=F_t/A_{max}$, wherein Amax is the maximum contact area between a grinding tooth and the thin film pressure sensor.

10. A method for on-line measurement of the wafer grinding force according to claim 9, wherein: the geometric shape of the force hammer is identical to that of the grinding tooth of the grinding wheel.

* * * * *